(12) United States Patent
Ikeuchi et al.

(10) Patent No.: US 7,605,095 B2
(45) Date of Patent: Oct. 20, 2009

(54) HEAT PROCESSING METHOD AND APPARATUS FOR SEMICONDUCTOR PROCESS

(75) Inventors: Toshiyuki Ikeuchi, Nirasaki (JP); Kota Umezawa, Nirasaki (JP); Tetsuya Shibata, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 74 days.

(21) Appl. No.: 12/068,452

(22) Filed: Feb. 6, 2008

(65) Prior Publication Data
US 2008/0200038 A1 Aug. 21, 2008

(30) Foreign Application Priority Data

Feb. 14, 2007 (JP) ............................ 2007-033983
Dec. 5, 2007 (JP) ............................ 2007-315255

(51) Int. Cl.
*H01L 21/8238* (2006.01)
*H01L 21/469* (2006.01)
*H01L 21/31* (2006.01)

(52) U.S. Cl. .................. 438/787; 438/225; 438/770; 438/774; 438/778; 118/715; 257/E21.278; 257/E21.279

(58) Field of Classification Search .......... 257/E21.278, 257/E21.279
See application file for complete search history.

(56) References Cited

U.S. PATENT DOCUMENTS

| | | | |
|---|---|---|---|
| 6,037,273 A | | 3/2000 | Gronet et al. |
| 6,146,135 A | * | 11/2000 | Watanabe et al. ........... 432/221 |
| 6,949,478 B2 | * | 9/2005 | Ohmi et al. .................. 438/774 |
| 7,300,885 B2 | | 11/2007 | Hasebe et al. |
| 2008/0107824 A1 | * | 5/2008 | Hasebe et al. ............... 427/576 |

FOREIGN PATENT DOCUMENTS

| | | |
|---|---|---|
| JP | 57-1232 | 1/1982 |
| JP | 3-140453 | 6/1991 |
| JP | 4-18727 | 1/1992 |
| JP | 2000-77401 | 3/2000 |
| JP | 2000-183055 | 6/2000 |
| JP | 2000-211998 | 8/2000 |
| JP | 2000-216156 | 8/2000 |
| JP | 2002-176052 | 6/2002 |

* cited by examiner

*Primary Examiner*—Charles D. Garber
*Assistant Examiner*—Mohsen Ahmadi
(74) *Attorney, Agent, or Firm*—Smith, Gambrell & Russell, LLP (57) ABSTRACT

A heat processing method for a semiconductor process includes placing a plurality of target substrates stacked at intervals in a vertical direction within a process field of a process container. Each of the target substrates includes a process object layer on its surface. Then, the method includes supplying an oxidizing gas and a deoxidizing gas to the process field while heating the process field, thereby causing the oxidizing gas and the deoxidizing gas to react with each other to generate oxygen radicals and hydroxyl group radicals, and performing oxidation on the process object layer of the target substrates by use of the oxygen radicals and the hydroxyl group radicals. Then, the method includes heating the process object layer processed by the oxidation, within an atmosphere of an annealing gas containing ozone or oxidizing radicals, thereby performing annealing on the process object layer.

13 Claims, 6 Drawing Sheets

HEAT PROCESSING METHOD AND APPARATUS FOR SEMICONDUCTOR PROCESS

BACKGROUND OF THE INVENTION

1. Field of the Invention

The present invention relates to a heat processing method and apparatus for a semiconductor process for performing a heat process to form an oxide film or oxynitride film on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor integrated circuits, a semiconductor substrate, such as a silicon wafer, is subjected to various processes, such as film formation, etching, oxidation, diffusion, and reformation, in general. For example, oxidation includes oxidation of the surface of a mono-crystalline silicon film or a poly-crystalline silicon film, and oxidation of a metal film. Particularly, a silicon oxide film formed by oxidation is applied to a device isolation film, gate oxide film, capacitor insulating film, or the like.

As regards methods for performing an oxidation process, where locking at them by the type of pressure, there is a normal-pressure oxidation method, in which the atmosphere inside a process container is set to be almost equal to atmospheric pressure. Further, there is a low-pressure oxidation method, in which the atmosphere inside a process container is set to be a vacuum. Where looking at them by the type of gas used for oxidation, there is a wet oxidation method, in which, for example, hydrogen and oxygen are burnt in an external combustion apparatus to generate water vapor, so as to perform oxidation by use of the water vapor (for example, Jpn. Pat. Appln. KOKAI Publication No. 3-140453 (Patent Document 1)). Further, there is a dry oxidation method, in which ozone or oxygen is solely supplied into a process container to perform oxidation without using water vapor (for example, Jpn. Pat. Appln. KOKAI Publication No. 57-1232 (Patent Document 2)).

As described above, oxidation can be performed by dry oxidation that employs oxygen gas, or wet oxidation that employs water vapor. In general, an oxide film formed by wet oxidation is higher in film quality than an oxide film formed by dry oxidation. Accordingly, in consideration of film properties, such as breakdown voltage, corrosion resistance, and reliability, a wet oxide film is better as an insulating film. On the other hand, the film formation rate of an oxide film (insulating film) to be formed and the planar uniformity therein on a wafer are also important factors. In this respect, a film formed by wet oxidation under a normal pressure shows a high oxidation rate, but shows poor planar uniformity in film thickness, in general. By contrast, a film formed by wet oxidation under a vacuum pressure shows a low oxidation rate, but shows good planar uniformity in film thickness.

Where the design rule of semiconductor devices or semiconductor integrated circuits is not so strict, various oxidation methods as those described above are selectively used, in consideration of, e.g., the intended purpose of oxide films, process conditions, and apparatus cost. On the other hand, in recent years, the line width and film thickness of semiconductor devices have decreased, and thus the design rule has become stricter. This tendency has given rise to demands on better planar uniformity in the quality and thickness of oxide films. However, conventional oxidation methods are now becoming inadequate in this regard, because they cannot sufficiently fulfill the demands.

Jpn. Pat. Appln. KOKAI Publication No. 4-18727 (Patent Document 3) discloses an oxidation apparatus utilizing a wet oxidation method. According to this apparatus, $H_2$ gas and $O_2$ gas are respectively supplied into the bottom of a vertical reaction tube made of quartz and are burnt in a combustion section formed in a quartz cap to generate water vapor. This water vapor flows upward along the array of wafers and performs an oxidation process on the wafers. In this case, since $H_2$ gas is burnt in the combustion section, the bottom of the process container near there is rich in water vapor. On the other hand, the top of the process container is poor in water vapor, because the water vapor is consumed while it flows upward. Consequently, the thickness of an oxide film formed on the wafers may vary greatly depending on the wafer support positions of the wafer boat, thereby deteriorating the inter-substrate uniformity in the oxide film thickness.

According to the apparatus disclosed in Jpn. Pat. Appln. KOKAI Publication No. 57-1232 (Patent Document 2) described above, a horizontal reaction tube of the batch type is used to array a plurality of semiconductor wafers side by side. $O_2$ gas is solely supplied or $O_2$ gas and $H_2$ gas are supplied at the same time from one side of the reaction tube to form an oxide film within a vacuum atmosphere. This apparatus is arranged to perform film formation within an atmosphere having a relatively high pressure by use of a hydrogen burning oxidation method, so the reaction is caused mainly by water vapor components. In this case, the concentration of the water vapor may vary greatly between the upstream side and downstream side of the gas flow inside the process container, thereby deteriorating the inter-substrate uniformity in the oxide film thickness, as in the case described above.

U.S. Pat. No. 6,037,273 (Patent Document 4) discloses an oxidation apparatus of another type. According to this apparatus, oxygen gas and hydrogen gas are supplied into a process chamber of the single-substrate type provided with heating lamps. These gases react with each other to generate water vapor near the surface of a semiconductor wafer placed inside the process chamber, so that silicon on the wafer surface is oxidized by this water vapor to form an oxide film.

However, according to this apparatus, oxygen gas and hydrogen gas are delivered into the process chamber from gas inlet 20 to 30 mm distant from the wafer, and react with each other to generate water vapor near the surface of the semiconductor wafer. Further, the process pressure is set at a relatively high value. These conditions may deteriorate the planar uniformity in the oxide film thickness.

Jpn. Pat. Appln. KOKAI Publication No. 2002-176052 (Patent Document 5) discloses an oxidation method of another type. According to this method, an oxidizing gas, such as $O_2$ gas, and a deoxidizing gas, such as $H_2$ gas, are supplied into a process chamber at the same time and react with each other within a vacuum atmosphere. Consequently, oxygen radicals and hydroxyl group radicals are generated and serve as the main part of the atmosphere, within which silicon wafers or the like are oxidized.

Jpn. Pat. Appln. KOKAI Publication No. 2000-183055 (Patent Document 6) discloses a method for forming an oxynitride film (SiON film) with high quality, as an insulating film other than the oxide film. According to this method, an $SiO_2$ film formed by, e.g., one of those methods described above is subjected to a nitridation process by use of ammonia, nitrogen monooxide (NO), or dinitrogen oxide (N$_2$O), thereby forming an SiON film. After the nitridation process, a re-oxidation process is performed by use of, e.g., O$_2$ gas to remove excessive N components.

BRIEF SUMMARY OF THE INVENTION

An object of the present invention is to provide a heat processing method and apparatus for a semiconductor process, which can form an oxide film or oxynitride film with good electric properties.

According to a first aspect of the present invention, there is provided a heat processing method for forming an oxide film in a semiconductor process, the method comprising: placing a plurality of target substrates stacked at intervals in a vertical direction within a process field of a process container, each of the target substrates including a process object layer on its surface; supplying an oxidizing gas and a deoxidizing gas to the process field while heating the process field, thereby causing the oxidizing gas and the deoxidizing gas to react with each other to generate oxygen radicals and hydroxyl group radicals, and performing oxidation on the process object layer of the target substrates by use of the oxygen radicals and the hydroxyl group radicals; and heating the process object layer processed by the oxidation, within an atmosphere of an annealing gas comprising ozone or oxidizing radicals, thereby performing annealing on the process object layer.

According to a second aspect of the present invention, there is provided a heat processing method for forming an oxide film in a semiconductor process, the method comprising: placing a plurality of target substrates stacked at intervals in a vertical direction within a process field of a process container, each of the target substrates including a process object layer on its surface; supplying an oxidizing gas and a deoxidizing gas to the process field while heating the process field, thereby causing the oxidizing gas and the deoxidizing gas to react with each other to generate oxygen radicals and hydroxyl group radicals, and performing oxidation on the process object layer of the target substrates by use of the oxygen radicals and the hydroxyl group radicals; heating the process object layer processed by the oxidation, within an atmosphere of a nitriding gas, thereby performing nitridation on the process object layer; and heating the process object layer processed by the nitridation, within an atmosphere of annealing gas comprising ozone or oxidizing radicals, thereby performing annealing on the process object layer.

According to a third aspect of the present invention, there is provided a heat processing apparatus for a semiconductor process, the apparatus comprising: a process container having a process field configured to accommodate a plurality of target substrates stacked at intervals in a vertical direction; a heater disposed around the process container and configured to heat the process field; an vacuum-exhaust system configured to exhaust gas from the process field; an oxidizing gas supply circuit configured to supply an oxidizing gas to the process field; an deoxidizing gas supply circuit configured to supply a deoxidizing gas to the process field; and an annealing gas supply circuit configured to supply an annealing gas comprising ozone or oxidizing radicals to the process field.

According to a fourth aspect of the present invention, there is provided a computer readable medium containing program instructions for execution on a processor, wherein the program instructions, when executed by the processor, control a heat processing apparatus for a semiconductor process to conduct a heat processing method comprising: placing a plurality of target substrates stacked at intervals in a vertical direction within a process field of a process container, each of the target substrates including a process object layer on its surface; supplying an oxidizing gas and a deoxidizing gas to the process field while heating the process field, thereby causing the oxidizing gas and the deoxidizing gas to react with each other to generate oxygen radicals and hydroxyl group radicals, and performing oxidation on the process object layer of the target substrates by use of the oxygen radicals and the hydroxyl group radicals; and supplying an annealing gas comprising ozone or oxidizing radicals to the process field while heating the process field, to heat the process object layer processed by the oxidation, within an atmosphere of the annealing gas, thereby performing annealing on the process object layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

In the process of developing the present invention, the inventors studied problems of conventional techniques for semiconductor processes, in relation to a method for forming an oxide film or oxynitride film by a heat process. As a result, the inventors have arrived at the findings given below.

For example, according to the heat processing methods disclosed in Patent Documents 1 to 6 described above, it is possible to form an oxide film with relatively good film quality and with relatively high planar uniformity in the oxide film thickness. However, it has been found that these conventional techniques may cause several problems, in light of the fact that insulating films used in semiconductor devices are required to have better properties and/or characteristics, in recent years. For example, as regards some electric characteristics, such as an SILC (Silicon Induced Leak Current) characteristic and a TDDB (Time Dependent Direct Breakdown) characteristic, these conventional techniques cannot sufficiently fulfill the demands that are becoming stricter. The SILC characteristic relates to a property of a silicon oxide film where it is used as a gate insulating film, and shows a leakage current through the film. The TDDB characteristic relates to a property of a silicon oxide film where it is used in a transistor, and shows an injected electric charge amount, which appears as a variation of the gate voltage, until breakdown while a constant current flows through the transistor. According to experiments, it is thought that deteriorations of these characteristics are due to residual hydrogen in the insulating film.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIRST EMBODIMENT

Figure 1:
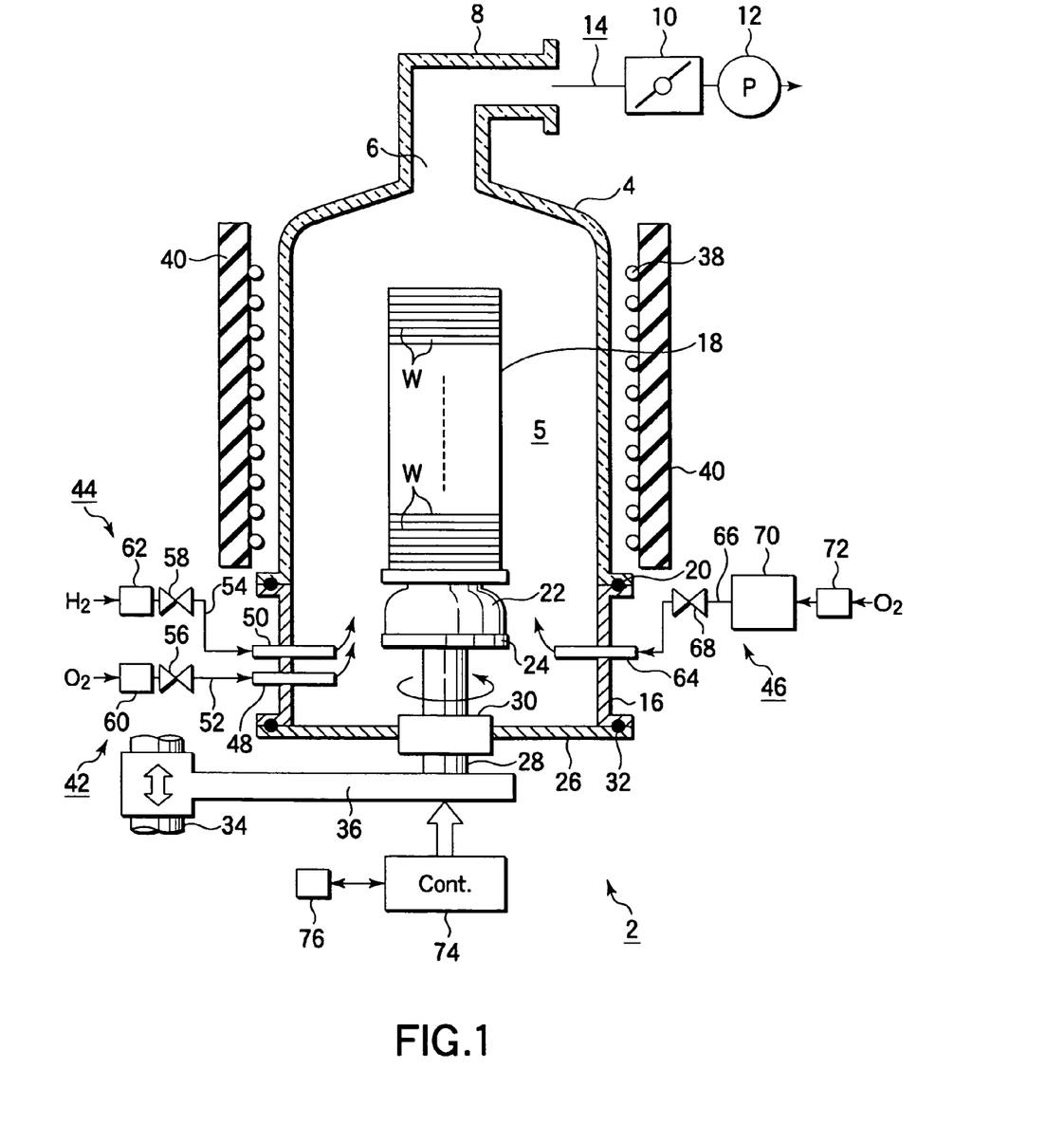
FIG. 1 is a view showing the structure of a vertical heat processing apparatus according to a first embodiment of the present invention.

FIG. 1 is a view showing the structure of a vertical heat processing apparatus according to a first embodiment of the present invention. As shown in FIG. 1, the processing apparatus 2 includes a vertical process container 4 having a cylindrical shape with an opened bottom, in which a process field 5 is defined to accommodate and process a plurality of semiconductor wafers (target substrates) stacked at intervals in a vertical direction. The process container 4 is made of a heat-resistant material, such as quartz.

An exhaust port 6 is formed at the top of the process container 4 and is connected to an exhaust line 8, which is bent at right angles in a horizontal direction, for example. The exhaust line 8 is connected to a vacuum-exhaust system 14 including a pressure control valve 10, a vacuum pump 12, and so forth to vacuum-exhaust the atmosphere inside the process container 4.

The bottom opening of the process container 4 is connected to a cylindrical manifold 38 through a seal member 20, such as an O-ring, so that the interior of the process container 4 can be kept airtight. The process container may be entirely formed of a cylindrical quartz column without a manifold 16 separately formed. The manifold 16 is made of, e.g., stainless steel, and supports the bottom of the process container 4. A wafer boat 18 made of quartz is moved up and down through the bottom port of the manifold 16, so that the wafer boat 18 is loaded/unloaded into and from the process container 34. A number of target substrates or semiconductor wafers W are stacked on a wafer boat 18. For example, in this embodiment, the wafer boat 18 can support, e.g., about 50 wafers having a diameter of 300 mm at essentially regular intervals in the vertical direction.

The wafer boat 18 is placed on a table 24 through a heat-insulating cylinder 22 made of quartz. The table 24 is supported by a rotary shaft 28 penetrating a lid 26 used for opening/closing the bottom port of the manifold 16. The portion of the lid 26 where the rotary shaft 28 penetrates is provided with, e.g., a magnetic-fluid seal 30, so that the rotary shaft 28 is rotatably supported in an airtightly sealed state. A seal member 32, such as an O-ring, is interposed between the periphery of the lid 26 and the bottom of the manifold 16, so that the interior of the process container 4 can be kept airtight.

The rotary shaft 28 is attached at the distal end of an arm 36 supported by an elevating mechanism 34, such as a boat elevator. The elevating mechanism 34 moves the wafer boat 18 and lid 26 up and down in unison. The table 24 may be fixed to the lid 26, so that wafers W are processed without rotation of the wafer boat 18.

The process container 4 is surrounded by a carbon wire heater 38 for heating the atmosphere and semiconductor wafers W inside the process container 4. The carbon wire heater can realize a clean process and has good characteristics for increasing and decreasing the temperature. The heater 38 is surrounded by a thermally insulating casing 40 for ensuring thermal stability.

The manifold 16 is connected to various gas supply circuits for supplying respective gases into the process container 4. Specifically, the manifold 16 is connected to an oxidizing gas supply circuit 42 for supplying an oxidizing gas to the process field 5, a deoxidizing gas supply circuit 44 for supplying an deoxidizing gas to the process field 5, and an ozone supply circuit 46 for supplying ozone to the process field 5. The manifold 16 is further connected to a purge gas supply circuit (not shown) for supplying a purge gas, such as $N_2$ gas. The two gas supply circuits 42 and 44 respectively include an oxidizing gas spouting nozzle 48 and a deoxidizing gas spouting nozzle 50, which penetrate the sidewall of the manifold 16 so that their distal ends are opened to the interior of the process container 4.

The spouting nozzles 48 and 50 are respectively connected to gas lines 52 and 54, which are provided with switching valves 56 and 58 and flow rate controllers 60 and 62, such as mass flow controllers, respectively. The switching valves 56 and 58 and flow rate controllers 60 and 62 are respectively controlled, so that the start/stop of supply of the respective gases and the gas flow rates thereof are controlled. In this embodiment, as an example, the oxidizing gas is $O_2$ gas and the deoxidizing gas is $H_2$ gas, and they are supplied to the bottom of the process container 4.

The ozone supply circuit 46 includes an ozone spouting nozzle 64, which penetrates the sidewall of the manifold 16 so that its distal end is opened to the interior of the process container 4. The ozone spouting nozzle 64 is connected to a gas line 66, which is provided with a switching valve 68, a flow rate controller 70, such as a mass flow controller, and an ozone generator 72, in this order. Accordingly, ozone is generated from $O_2$ and supplied to the bottom of the process container 4 at controlled flow rate, as needed.

The operation of the processing apparatus 2 structured as described above is controlled as a whole by a controller 74, such as a computer. Computer programs for executing operations of the apparatus 2 are stored in a storage section 76 comprising a storage medium, such as a floppy disk, CD (Compact Disc), hard disk, and/or flash memory. In accordance with instructions from the controller 74, the start/stop of supply of the respective gases (including ozone), the gas flow rates thereof, the process temperature, and the process pressure are controlled.

In this embodiment, the process container 4 has a single-tube structure, but it may have a double-tube structure, which is formed of inner and outer tubes. The arrangement of the nozzles of the respective gases (including ozone) is not limited to that shown in FIG. 1. For example, a nozzle may be formed of a pipe extending along the height of the wafer boat 18 and having a number of spouting holes formed thereon, so that the corresponding gas is spouted uniformly across the height of the wafer boat 18.

Figure 2:
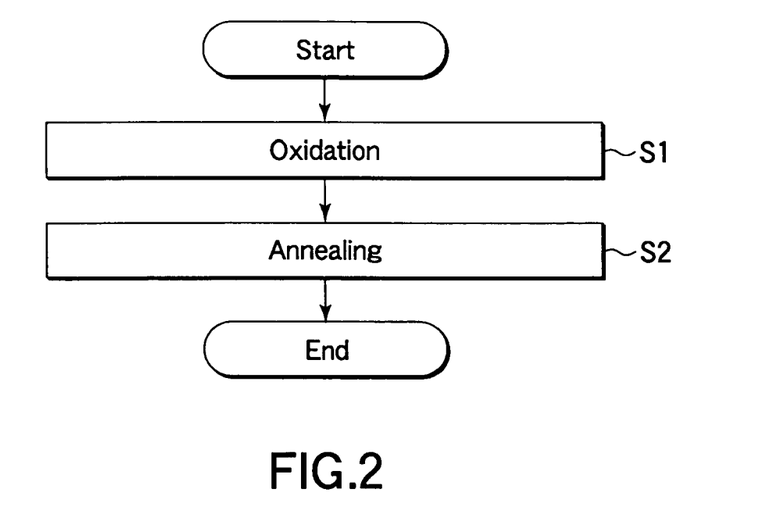
FIG. 2 is a flow chart showing an example of a process for forming an SiO$_2$ film by a heat processing method according to the first embodiment.

Next, with reference also to FIG. 2, an explanation will be given of a heat processing method according to the first embodiment performed in the processing apparatus 2 having the structure described above. FIG. 2 is a flow chart showing an example of a process for forming an SiO₂ film by a heat processing method according to the first embodiment. FIG. 2 is exemplified by a case where an SiO₂ film is formed as an insulating film by oxidation on the surface of semiconductor wafers.

Specifically, according to this processing method, at first, an oxidizing gas and a deoxidizing gas are caused to react with each other within the process field 5 to form an atmosphere comprising oxygen radicals and hydroxyl group radicals, so that oxidation is performed on the surface of semiconductor wafers W to form an oxide film (oxidation step S1). Then, annealing is performed on the oxide film by heating within an atmosphere comprising ozone or oxidizing gas radicals (annealing step S2). These steps are sequentially performed within the same process field 5, thereby forming an SiO₂ film containing only a smaller amount of hydrogen therein.

Specifically, when the processing apparatus 2 is set in standby with no semiconductor wafers W, such as silicon wafers, loaded therein, the process field 5 is maintained at a temperature lower than the process temperature. When the process is started, at first, a number of, such as 50, semiconductor wafers W are inserted into the wafer boat 18 at predetermined intervals in the vertical direction. Then, the wafer boat 18 is moved up by the boat elevator 34 and loaded into the process container 4 in a hot wall state from below, so that the wafer boat 18 is placed within the process field 5. Further, the bottom port of the manifold 16 is closed by the lid 26 to airtightly seal the process container 4.

Then, the interior of the process container 4 is vacuum-exhausted by the vacuum-exhaust system 14 to set the process field 5 at a predetermined process pressure. Further, the power applied to the heater 38 is increased to heat the wafers W and process field 5 to the process temperature for the oxidation process. After the temperature of the process field 5 is stabilized, predetermined process gases necessary for the oxidation step, i.e., O₂ gas and H₂ gas are supplied at controlled flow rates respectively from the oxidizing gas spouting nozzle 48 and deoxidizing gas spouting nozzle 50 of the gas supply circuits 42 and 44 to the process field 5. At this time, ozone is not yet supplied.

These two gases react with each other within the vacuum atmosphere and generate hydroxyl group radicals and oxygen radicals while they flow upward through the process field 5. The hydroxyl group radicals and oxygen radicals come into contact with wafers W supported on the wafer boat 18 that is being rotated, and bring about an oxidation process onto the wafer surface (step S1). The process gas thus used and/or gases generated by the reaction are exhausted out of the process container 4 through the exhaust port 6 at the top of the process container 4.

At this time, the flow rate of H₂ gas is set to be 200 to 5,000 sccm, such as 600 sccm. The flow rate of O₂ gas is set to be 200 to 10,000 sccm, such as 1,200 sccm. The process temperature is set to be 500 to 1,200° C., such as 900° C. The process pressure is set to be 0.02 Torr (2.7 Pa) to 3.0 Torr (400 Pa), such as 0.35 Torr (46 Pa). The process time is set to be, e.g., 10 minutes.

The O₂ gas and H₂ gas thus supplied respectively into the process container 4 flow upward through the process field 5 inside the process container 4 in a hot wall state. These gases cause a hydrogen burning reaction in the vicinity of wafers W to form an atmosphere mainly formed of oxygen radicals (O*) and hydroxyl group radicals (OH*). The surface of the wafers W is oxidized by these radicals and an SiO₂ film is thereby formed. At this time, the generation of radicals proceeds as follows. Specifically, where hydrogen and oxygen are respectively supplied into a vacuum atmosphere inside the process container 4 in a hot wall state, a hydrogen burning reaction is caused in the vicinity of the wafers W, probably as follows. In the following formulas, a chemical element with a symbol "*" denotes that it is a radical.

$$H_2+O_2 \rightarrow H^*+HO_2$$

$$O_2+H^* \rightarrow OH^*+O^*$$

$$H_2+O^* \rightarrow H^*+OH^*$$

$$H_2+OH^* \rightarrow H^*+H_2O$$

As described above, where H₂ and O₂ are respectively supplied to the process field 5, O* (oxygen radical), OH* (hydroxyl group radical), and H₂O (water vapor) are generated in the process of a hydrogen burning reaction, and bring about oxidation on the wafer surface to form an SiO₂ film. At this time, probably, radicals O* and OH* described above mainly serve for the oxidation.

Due to hydrogen used as a deoxidizing gas, hydrogen components are contained in the SiO₂ film thus formed and deteriorate some electric properties of the film. In light of this problem, an annealing step is then performed within an ozone atmosphere to remove hydrogen components from the film (step S2).

Specifically, the supply of O₂ gas and H₂ gas described above is stopped, and the ozone supply circuit 46 is operated to generate ozone (O₃) by the ozone generator 72. The ozone thus generated is supplied into the process container 4 at a controlled flow rate to set an ozone atmosphere inside the process container 4. Further, the wafers W are heated within the ozone atmosphere to perform an annealing process.

At this time, the process pressure is set to be 0.1 Torr (13.3 Pa) to 76 Torr (10,130 Pa), and preferably 0.1 Torr (13.3 Pa) to 10 Torr (1,330 Pa), such as 0.35 Torr (47 Pa). If the process pressure is lower than 0.1 Torr (13.3 Pa), the annealing effect becomes insufficient. If the process pressure is higher than 76 Torr (10,130 Pa), ozone is extremely deactivated. The process temperature is set to be 500 to 1,200° C., and preferably 300 to 1,000° C. If the process temperature is lower than 500° C., the annealing effect becomes insufficient. If the process temperature is higher than 1,200° C., the apparatus is adversely affected in terms of its heat-resistance. In order to improve the throughput, the temperature of the annealing step is preferably set to be the same as the process temperature of the oxidation step, thereby excluding the time necessary for wafer temperature increase/decrease. In this embodiment, for example, the process temperature of the annealing step is set at 900° C., which is the same as that of the oxidation step.

In the annealing step, the ozone concentration (O₃/(O₃+O₂)) is set to be 5 to 20 vol % inside the process field 5, which is determined in light of the function of present ozone generators and the cost effectiveness of ozone concentration relative to the annealing characteristics. However, a higher ozone concentration may further improve annealing characteristics, so a higher concentration of, e.g., about 100 vol % may be used. In this embodiment, the flow rate of ozone is set to be 0.1 to 10 slm, and the ozone concentration (O₃/(O₃+O₂)) is set at 10 vol %.

Where the annealing process is performed within the ozone atmosphere, hydrogen components are removed from the SiO₂ film, probably in the following manner. Specifically, oxygen radicals are generated by decomposition of ozone and react with hydrogen components in the SiO₂ film. Consequently, the hydrogen components are changed into OH and/or $H_2O$, which are then desorbed from the film.

<Examination Result>

Figure 3:
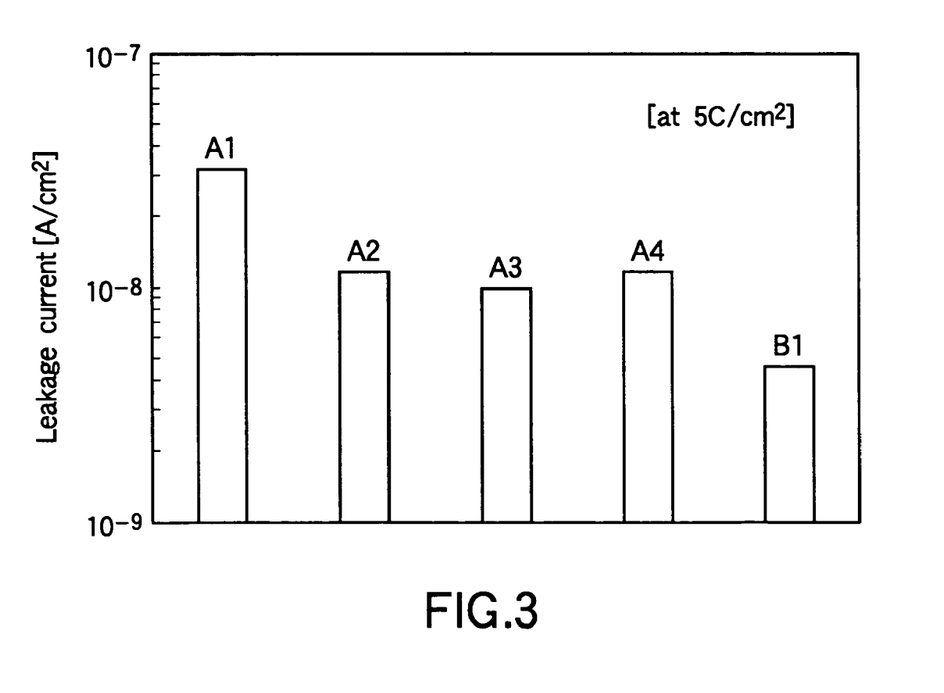
FIG. 3 is a graph showing the annealing dependence of the SILC characteristic of a silicon oxide film, obtained by an experiment associated with the first embodiment.

An $SiO_2$ film was formed by a film formation method according to the first embodiment described above, and was measured and examined in terms of electric properties thereof. FIG. 3 is a graph showing the annealing dependence of the SILC characteristic of a silicon oxide film. The SILC characteristic is defined as described previously. The SILC characteristic shown in FIG. 3 represents a leakage current at an electric charge of 5 [$C/cm^2$].

FIG. 3 further shows results concerning $SiO_2$ films formed by other film formation methods according to various comparative examples A1 to A4. In a comparative example A1, an $SiO_2$ film was formed by dry oxidation. In a comparative example A2, an $SiO_2$ film was formed by wet oxidation. In a comparative example A3, an $SiO_2$ film was formed merely by an oxidation process in the apparatus shown in FIG. 1 (without ozone annealing). In a comparative example A4, an $SiO_2$ film was formed and annealed within an $N_2$ atmosphere (at 1000° C.) in the apparatus shown in FIG. 1. In a present example B1, an $SiO_2$ film was formed and annealed within an ozone atmosphere (at 500° C.) by a method according to the first embodiment.

As shown in FIG. 3, the $SiO_2$ film formed by dry oxidation according to the comparative example A1 rendered the largest leakage current of about $0.3 \times 10^{-7}$ ($A/cm^2$), and thus had the worst film quality. The comparative examples A2 to A4 rendered leakage currents of about $1 \times 10^{-8}$ ($A/cm^2$), which were somewhat smaller than that of the comparative example A1 but they were insufficiently decreased. Particularly, as indicated by the comparative example A4, even where the annealing was performed at 1000° C., the $N_2$ gas atmosphere merely rendered an insufficiently effect.

On the other hand, the $SiO_2$ film of the present example B1 formed by a method according to the first embodiment rendered a smaller leakage current of about $0.5 \times 10^{-8}$ ($A/cm^2$), because the annealing was performed within an ozone atmosphere even though a lower temperature of 500° C. was used. This leakage current was far lower than those of the comparative examples A1 to A4, thus the film had better film quality.

Figure 4:
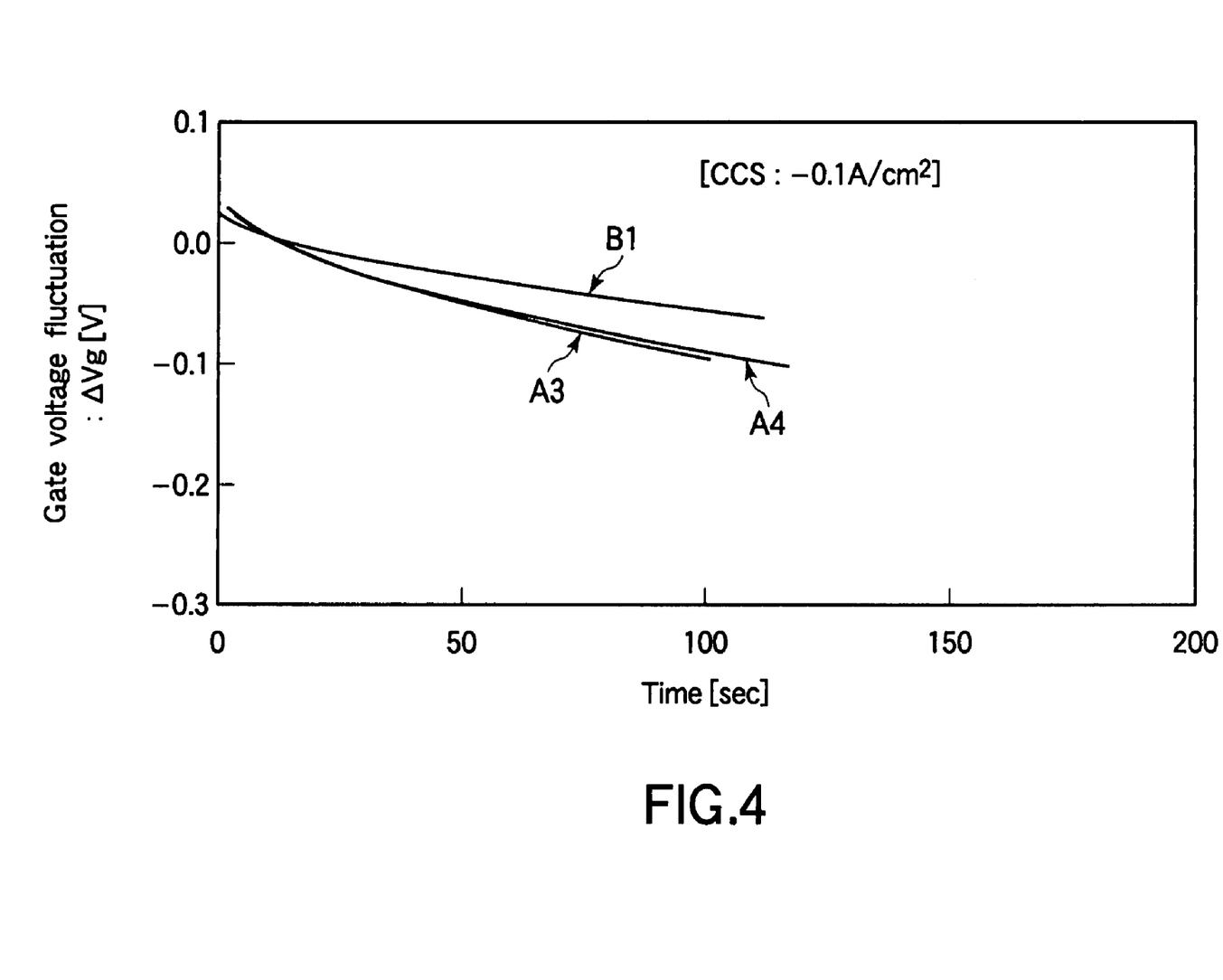
FIG. 4 is a graph showing the annealing dependence of the TDDB characteristic of a silicon oxide film, obtained by an experiment associated with the first embodiment.

FIG. 4 is a graph showing the annealing dependence of the TDDB characteristic of a silicon oxide film. The TDDB characteristic is defined as described previously. In this experiment, CCS (Constant Current Stress) was set at $-0.1$ $A/cm^2$. FIG. 4 shows the results only of the comparative examples A3 and A4 and the present example B1 representing a method according to the first embodiment.

As shown in FIG. 4, each of the comparative examples A3 and A4 rendered a gate voltage Vg decreasing considerably with time, which was not preferable. On the other hand, the present example B1 representing a method according to the first embodiment rendered a gate voltage Vg less decreasing with time, which indicated that good film quality was maintained. In other words, it has been confirmed that the first embodiment can suppress the fluctuation of the gate voltage Vg, and thus greatly decrease the hole trap amount and electron trap amount. It should be noted that, in the present circumstances, there is no method for directly measuring the hydrogen component amount in a film, but the amount can be indirectly confirmed by the SILC characteristic or TDDB characteristic, as described above.

SECOND EMBODIMENT

Figure 5:
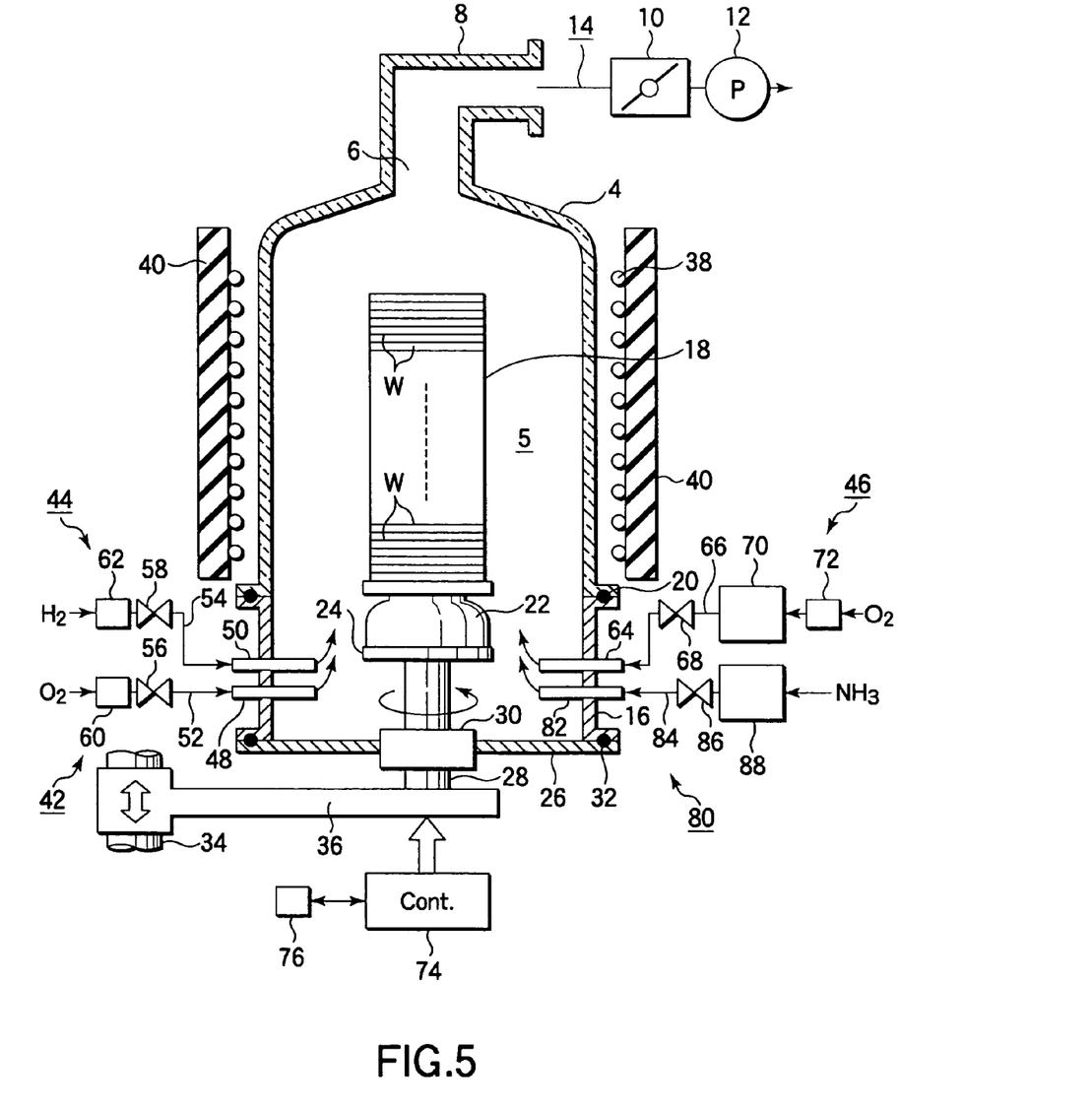
FIG. 5 is a view showing the structure of a vertical heat processing apparatus according to a second embodiment of the present invention.
Figure 6:
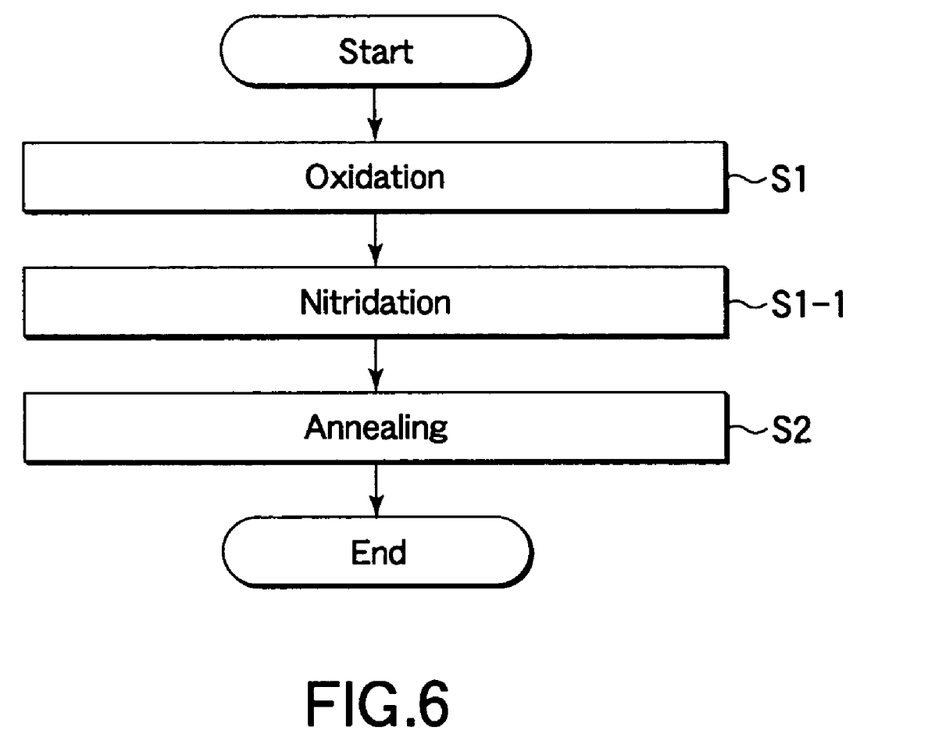
FIG. 6 is a flow chart showing an example of a process for forming an SiON film by a heat processing method according to the second embodiment.

FIG. 5 is a view showing the structure of a vertical heat processing apparatus according to a second embodiment of the present invention. FIG. 6 is a flow chart showing an example of a process for forming an SiON film by a heat processing method according to the second embodiment.

The heat processing apparatus shown in FIG. 5 has a structure similar to that of the heat processing apparatus shown in FIG. 1, but it differs therefrom in that a nitriding gas supply circuit 80 is further disposed to supply a nitriding gas into the process container. With this arrangement, this heat processing apparatus can be used to form an SiON film by nitriding an $SiO_2$ film, as described below.

Specifically, the nitriding gas supply circuit 80 includes a nitriding gas spouting nozzle 82, which penetrates the sidewall of the manifold 16 so that its distal ends is opened to the interior of the process container 4.

The nitriding gas spouting nozzle 82 is connected to a gas line 84, which is provided with a switching valve 86 and a flow rate controller 88, such as mass flow controllers. Accordingly, the nitriding gas is supplied to the bottom of the process container 4 at controlled flow rate, as needed.

In this embodiment, $NH_3$ is used as the nitriding gas. However, the nitriding gas may be one or more gases selected from the group consisting of NO, $N_2O$, and $NH_3$.

In the heat processing apparatus according to the second embodiment, as shown in the flow chart of FIG. 6, a nitridation step S1-1 is performed between the oxidation step S1 and annealing step S2. Specifically, after an $SiO_2$ film is formed in the step S1, the supply of $H_2$ gas and $O_2$ gas is stopped, and the nitriding gas is supplied at a controlled flow rate from the nitriding gas supply circuit 80 to the process field 5. Consequently, an oxide film or $SiO_2$ film formed on the surface of the wafers W is nitrided by the nitriding gas, and an oxynitride film or SiON film is thereby formed.

At this time, the process pressure is set to be 100 to 760 Torr, such as 650 Torr. The process temperature is set to be 500 to 1,200° C. The flow rate of the nitriding gas is set to be 0.1 to 10 slm.

After the SiON film is formed by the process described above, the annealing step S2 shown in FIG. 6 is performed in the same way as the step S2 in FIG. 2 to remove hydrogen components from the SiON film.

The process conditions, such as the process pressure, the process temperature, and the flow rate of ozone, used in the step S2 (annealing step) in FIG. 6 may be set to be the same as those described with reference to the step S2 in FIG. 2. However, the process conditions used in the step S2 in FIG. 6 may differ from those of the step S2 in FIG. 2.

Also in the second embodiment, in order to improve the throughput, the temperatures of the oxidation step S1, nitridation step S1-1, and annealing step S2 are preferably set to be the same. In this embodiment, for example, the process temperatures of the nitridation step and annealing step are set at 900° C., which is the same as that of the oxidation step.

Where the annealing process is performed within the ozone atmosphere, hydrogen components are removed from the SiON film in the manner described above with reference to an $SiO_2$ film.

<Examination Result>

Figure 7:
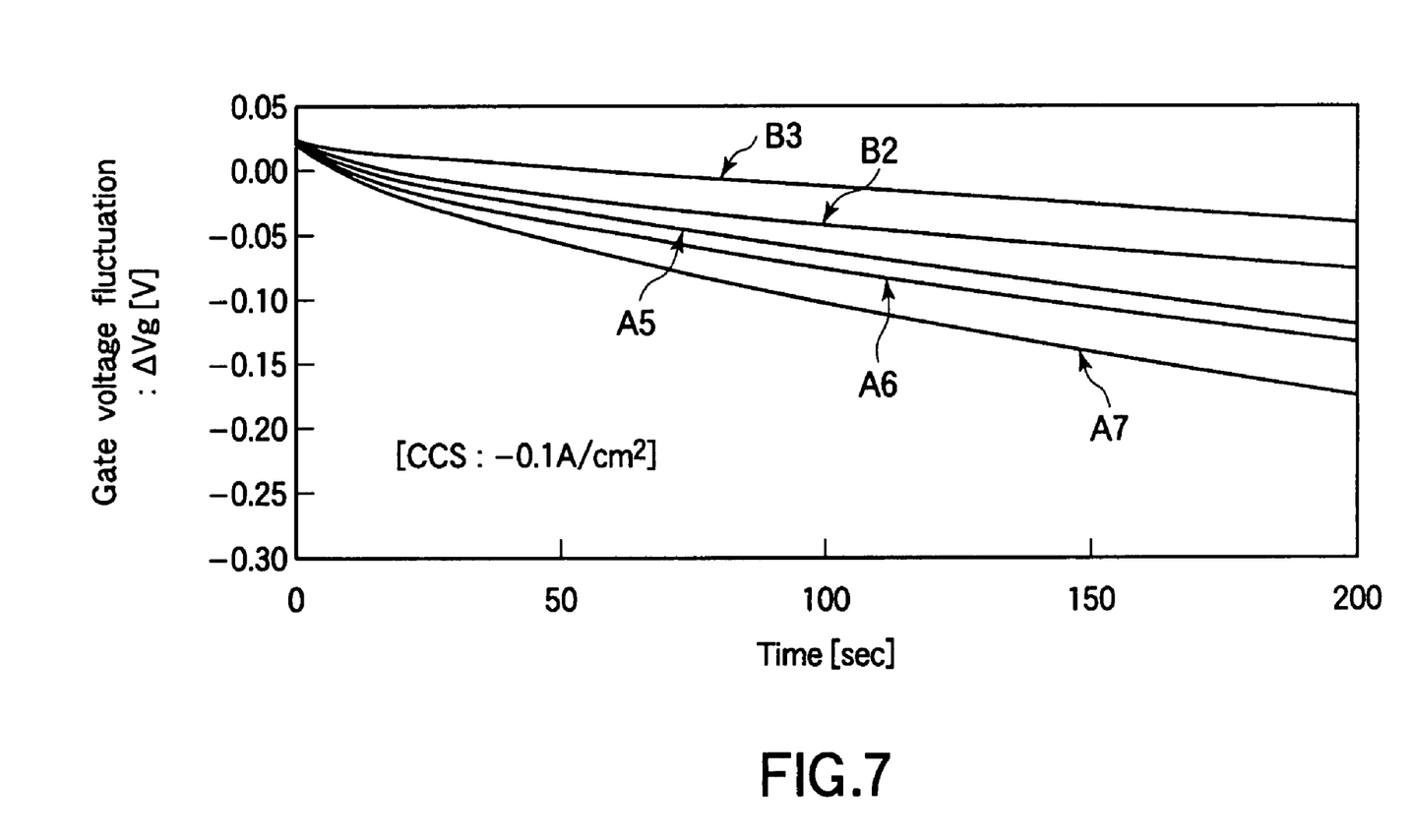
FIG. 7 is a graph showing the annealing dependence of the TDDB characteristic of a silicon oxynitride film, obtained by an experiment associated with the second embodiment.

An SiON film was formed by a film formation method according to the second embodiment described above, and was measured and examined in terms of electric properties thereof. FIG. 7 is a graph showing the annealing dependence of the TDDB characteristic of a silicon oxide film. In this experiment, CCS was set at $-0.1$ $A/cm^2$.

FIG. 7 further shows results concerning SiON films formed by other film formation methods according to various comparative examples A5 to A7. In a comparative example A5, an SiON film was formed and then subjected to a re-oxidation process within an $O_2$ gas atmosphere at 900° C. In a comparative example A6, no annealing process was performed after an SiON film was formed. In a comparative example A7, an SiON film was formed and then annealed within an $N_2$ gas atmosphere (at 900° C.). In a present example B2, an SiON film was formed and then annealed within an ozone atmosphere (at 600° C.) by a method according to the second embodiment. In a present example B3, an SiON film was formed and then annealed within an ozone atmosphere (at 900° C.) by a method according to the second embodiment.

As shown in FIG. 7, each of the comparative examples A5 to A7 rendered a gate voltage Vg decreasing considerably with time, which was not preferable. The decreasing degrees of the comparative example A5 to A7 were more drastic in this order. On the other hand, each of the present examples B2 and B3 representing a method according to the second embodiment rendered a gate voltage Vg less decreasing with time, which indicated that good film quality was maintained. In other words, it has been confirmed that the second embodiment can suppress the fluctuation of the gate voltage Vg, and thus greatly decrease the hole trap amount and electron trap amount. As compared with the present example B2 having an annealing temperature of 600° C., the present example B3 having an annealing temperature of 900° C. rendered a smaller decrease in the gate voltage Vg. Accordingly, it has been confirmed that a higher annealing temperature can maintain better film quality.

<Matters Common to First and Second Embodiments>

In the embodiments described above, the annealing step is performed within an ozone atmosphere. Alternatively, the annealing step may be performed within an atmosphere comprising oxidizing gas radicals and no hydrogen components. This oxidizing gas may be $O_2$, NO, or $NO_2$ gas. For example, in this case, oxidizing gas radicals may be generated by a plasma exciting mechanism disclosed in U.S. Pat. No. 7,300,885 B2, the teachings of which are hereby incorporated by reference. This plasma exciting mechanism includes a pair of electrodes extending along the side of a vertical process container and configured to be supplied with a radio frequency voltage. With this plasma exciting mechanism, the oxidizing gas is turned into plasma and oxidizing radicals are thereby generated. Alternatively, an exciting mechanism of the so-called remote plasma type may be used such that oxidizing radicals are generated by use of plasma outside the process container and supplied into the process container.

In the embodiments described above, the oxidizing gas is $O_2$ gas. In this respect, the oxidizing gas may be one or more gases selected from the group consisting of $O_2$, $N_2O$, NO, $NO_2$, and $O_3$.

In the embodiments described above, the deoxidizing gas is $H_2$ gas. In this respect, the deoxidizing gas may be one or more gases selected from the group consisting of $H_2$, $NH_3$, $CH_4$, HCl, and deuterium.

Where the oxidizing gas is $O_3$ (ozone), the oxidizing gas supply circuit 42 can be used as an ozone supply circuit as well, and thus the ozone supply circuit 46 may be omitted from the heat processing apparatus 2 shown in FIG. 1. Where the oxidizing gas and nitriding gas are the same gas, such as NO or $NO_2$, the oxidizing gas supply circuit 42 can be used as a nitriding gas supply circuit as well, and thus the nitriding gas supply circuit 80 may be omitted from the heat processing apparatus shown in FIG. 5.

In the embodiments described above, the steps from the oxidation step to the annealing step are performed inside the same process container. Alternatively, these steps may be performed in respective process containers (processing apparatuses). The oxidation target material is not limited to silicon, and it may be another semiconductor material, oxide film, or oxynitride film. As regards the target substrate, the present invention may be applied to a glass substrate, LCD substrate, or ceramic substrate, in place of a semiconductor wafer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A heat processing method for forming an oxide film in a semiconductor process, the method comprising:

placing a plurality of target substrates stacked at intervals in a vertical direction within a process field of a process container, each of the target substrates including a process object layer on its surface;

supplying an oxidizing gas and a deoxidizing gas to the process field while heating the process field, thereby causing the oxidizing gas and the deoxidizing gas to react with each other to generate oxygen radicals and hydroxyl group radicals, and performing oxidation on the process object layer of the target substrates by use of the oxygen radicals and the hydroxyl group radicals; and heating the process object layer processed by the oxidation, within an atmosphere of an annealing gas comprising ozone or oxidizing radicals, thereby performing annealing on the process object layer, wherein the oxidizing gas comprises one or more gases selected from the group consisting of $O_2$, $N_2O$, NO, $NO_2$, and $O_3$, and the deoxidizing gas comprises one or more gases selected from the group consisting of $H_2$, $NH_3$, $CH_4$, HCl, and deuterium, and wherein the oxidation is arranged to use a process temperature of 500 to 1,200° C. and a process pressure of 0.02 Torr (2.7 Pa) to 3.0 Torr (400 Pa).

2. The method according to claim 1, wherein the annealing is performed within the process field by supplying the annealing gas to the process field while heating the process field.

3. The method according to claim 1, wherein the annealing gas comprises ozone.

4. The method according to claim 3, wherein the annealing is arranged to use a process temperature of 500 to 1,200° C. and a process pressure of 0.1 Torr (13.3 Pa) to 76 Torr (10,130 Pa).

5. The method according to claim 1, wherein the process object layer comprises silicon.

6. A heat processing method for forming an oxide film in a semiconductor process, the method comprising:

placing a plurality of target substrates stacked at intervals in a vertical direction within a process field of a process container, each of the target substrates including a process object layer on its surface;

supplying an oxidizing gas and a deoxidizing gas to the process field while heating the process field, thereby causing the oxidizing gas and the deoxidizing gas to react with each other to generate oxygen radicals and hydroxyl group radicals, and performing oxidation on the process object layer of the target substrates by use of the oxygen radicals and the hydroxyl group radicals;

heating the process object layer processed by the oxidation, within an atmosphere of a nitriding gas, thereby performing nitridation on the process object layer; and heating the process object layer processed by the nitridation, within an atmosphere of annealing gas comprising ozone or oxidizing radicals, thereby performing annealing on the process object layer, wherein the oxidizing gas comprises one or more gases selected from the group consisting of $O_2$, $N_2O$, NO, $NO_2$, and $O_3$, and the deoxidizing gas comprises one or more gases selected from the group consisting of $H_2$, $NH_3$, $CH_4$, HCl, and deuterium, and wherein the oxidation is arranged to use a process temperature of 500 to 1,200° C. and a process pressure of 0.02 Torr (2.7 Pa) to 3.0 Torr (400 Pa).

7. The method according to claim 6, wherein the nitridation is performed within the process field by supplying the nitriding gas to the process field while heating the process field, and the annealing is performed within the process field by supplying the annealing gas to the process field while heating the process field.

8. The method according to claim 6, wherein the annealing gas comprises ozone.

9. The method according to claim 8, wherein the annealing is arranged to use a process temperature of 500 to 1,200° C. and a process pressure of 0.1 Torr (13.3 Pa) to 76 Torr (10,130 Pa).

10. The method according to claim 6, wherein the nitriding gas comprises one or more gases selected from the group consisting of NO, $N_2O$, and $NH_3$.

11. The method according to claim 10, wherein the nitridation is arranged to use a process temperature of 500 to 1,200° C. and a process pressure of 100 Torr (13300 Pa) to 760 Torr (10,1300 Pa).

12. The method according to claim 6, wherein the process object layer comprises silicon.

13. A computer readable medium containing program instructions for execution on a processor, wherein the program instructions, when executed by the processor, control a heat processing apparatus for a semiconductor process to conduct a heat processing method comprising:

placing a plurality of target substrates stacked at intervals in a vertical direction within a process field of a process container, each of the target substrates including a process object layer on its surface;

supplying an oxidizing gas and a deoxidizing gas to the process field while heating the process field, thereby causing the oxidizing gas and the deoxidizing gas to react with each other to generate oxygen radicals and hydroxyl group radicals, and performing oxidation on the process object layer of the target substrates by use of the oxygen radicals and the hydroxyl group radicals; and supplying an annealing gas comprising ozone or oxidizing radicals to the process field while heating the process field, to heat the process object layer processed by the oxidation, within an atmosphere of the annealing gas, thereby performing annealing on the process object layer, wherein, after the oxidation and before the annealing, the method further comprises supplying a nitriding gas to the process field while heating the process field, to heat the process object layer processed by the oxidation, within an atmosphere of the nitriding gas, thereby performing nitridation on the process object layer.

* * * * *